United States Patent
Hosni et al.

(10) Patent No.: US 11,955,870 B2
(45) Date of Patent: Apr. 9, 2024

(54) ELECTRONIC SYSTEM AND ELECTRICAL ASSEMBLY

(71) Applicant: VALEO EQUIPEMENTS ELECTRIQUES MOTEUR, Creteil (FR)

(72) Inventors: Alexis Hosni, Creteil (FR); Mathieu Varillon, Creteil (FR)

(73) Assignee: VALEO EQUIPEMENTS ELECTRIQUES MOTEUR, Creteil (FR)

( * ) Notice: Subject to any disclaimer, the term of this patent is extended or adjusted under 35 U.S.C. 154(b) by 402 days.

(21) Appl. No.: 17/438,161

(22) PCT Filed: Mar. 3, 2020

(86) PCT No.: PCT/EP2020/055579
§ 371 (c)(1),
(2) Date: Sep. 10, 2021

(87) PCT Pub. No.: WO2020/182547
PCT Pub. Date: Sep. 17, 2020

(65) Prior Publication Data
US 2022/0115933 A1  Apr. 14, 2022

(30) Foreign Application Priority Data
Mar. 13, 2019 (FR) .................... 1902545

(51) Int. Cl.
*H02K 11/33* (2016.01)
*H02K 5/22* (2006.01)
(Continued)

(52) U.S. Cl.
CPC ......... *H02K 5/225* (2013.01); *H02K 11/0094* (2013.01); *H02K 11/33* (2016.01);
(Continued)

(58) Field of Classification Search
CPC ........ H02K 11/33; H02K 11/30; H02K 5/225; H02K 11/0094; H02K 5/16; H02K 5/18; H02G 5/06; H05K 7/14329; H02M 7/537
(Continued)

(56) References Cited

U.S. PATENT DOCUMENTS

2009/0237905 A1   9/2009  Motoda
2014/0140119 A1*  5/2014  Shinohara ............ H05K 7/1432
                                                    363/141
(Continued)

FOREIGN PATENT DOCUMENTS

CN          2422736 Y      3/2001
CN        101540520 A      9/2009
(Continued)

OTHER PUBLICATIONS

Combined Chinese Office Action and Search Report dated Aug. 24, 2022, in corresponding Chinese Patent Application No. 202080030280.4 (with English Translation of Category of Cited Documents), 7 pages.

(Continued)

*Primary Examiner* — Alexander A Singh
(74) *Attorney, Agent, or Firm* — Oblon, McClelland, Maier & Neustadt, L.L.P.

(57) ABSTRACT

An electronic system includes a casing including a first bearing surface, a first busbar attached to the casing and including a first connection end having a first connection surface, and an electronic unit having a second bearing surface and including a second busbar having a second connection end having a second connection surface. The second bearing surface is intended to slide on the first bearing surface when the electronic unit is inserted into the casing. One from among the first bearing surface and the second bearing surface includes a ramp that is inclined (Continued)

relative to the insertion direction for deforming the second busbar so as to bring the second connection surface closer to the first connection surface when the electronic unit is inserted into the casing. An electrical assembly may include such an electronic system and a rotary electric machine.

20 Claims, 9 Drawing Sheets

(51) Int. Cl.
| | | |
|---|---|---|
| *H02K 11/00* | (2016.01) | |
| *H02G 5/06* | (2006.01) | |
| *H02K 5/16* | (2006.01) | |
| *H02K 5/18* | (2006.01) | |
| *H02M 7/537* | (2006.01) | |

(52) U.S. Cl.
CPC ............... *H02G 5/06* (2013.01); *H02K 5/16* (2013.01); *H02K 5/18* (2013.01); *H02M 7/537* (2013.01)

(58) Field of Classification Search
USPC .......................................... 310/71
See application file for complete search history.

(56) References Cited

U.S. PATENT DOCUMENTS

| | | | |
|---|---|---|---|
| 2014/0160823 A1 | 6/2014 | Uetake et al. | |
| 2018/0334116 A1* | 11/2018 | Sanvito | ................... B60R 16/03 |
| 2020/0195083 A1* | 6/2020 | Ueno | ................... H02K 5/1732 |

FOREIGN PATENT DOCUMENTS

| | | |
|---|---|---|
| CN | 103688458 A | 3/2014 |
| CN | 103733496 A | 4/2014 |
| CN | 108942230 A | 12/2018 |
| EP | 2 109 186 A1 | 10/2009 |
| EP | 2 736 160 A1 | 5/2014 |
| EP | 2 741 412 A1 | 6/2014 |
| GB | 1 226 864 A | 3/1971 |
| JP | 2010-41871 A | 2/2010 |
| JP | 2013-16434 A | 1/2013 |
| JP | 2016-103943 A | 6/2016 |

OTHER PUBLICATIONS

International Search Report dated Apr. 20, 2020 in PCT/EP2020/055579 filed on Mar. 3, 2020, 2 pages.

* cited by examiner

ELECTRONIC SYSTEM AND ELECTRICAL ASSEMBLY

The invention relates to an electronic system comprising a means for bringing two busbars that are connected to one another closer together and to an electrical assembly comprising such an electronic system.

In a known manner, an electronic system comprises:
a casing;
a first busbar, for example a busbar of a power electronic module intended to supply power to a winding of a phase of a rotary electric machine, attached to the casing and comprising a first connection end having a first connection surface.
an electronic unit, for example a filter block comprising a capacitor, intended to be inserted into the casing in an insertion direction comprising:
a support,
a second busbar attached to the support and comprising a second connection end having a second connection surface,
wherein an electrical connection between the first connection surface and the second connection surface is made by electric welding.

To perform the electric welding, it is necessary to press the first connection surface against the second connection surface and to pass an electric current between the first connection surface and the second connection surface. Pressing the first connection surface against the second connection surface requires the use of a bulky press tool, limiting in particular the possibility of installing electronic components close to the electrical connection.

In order to address this problem of the substantial amount of space required for the tools, it has also been envisaged to perform laser welding between the first connection surface and the second connection surface. However, this type of welding requires precise spacing between the first connection surface and the second connection surface. Such precise spacing is difficult to achieve, in particular because of a long chain of dimensions between the first connection surface and the second connection surface.

The invention aims to overcome all or some of these drawbacks.

The invention relates to an electronic system comprising:
a casing comprising a first bearing surface,
a first busbar attached to the casing and comprising a first connection end having a first connection surface,
an electronic unit comprising a second bearing surface, the electronic unit being intended to be inserted into the casing in an insertion direction and the electronic unit comprising:
a support,
a second busbar attached to the support and comprising a second connection end having a second connection surface,
the second bearing surface being intended to slide on the first bearing surface when the electronic unit is inserted into the casing,
wherein one from among the first bearing surface and the second bearing surface comprises a ramp that is inclined relative to the insertion direction for deforming the second busbar so as to bring the second connection surface closer to the first connection surface when the electronic unit is inserted into the casing.

The use of such an inclined ramp makes it possible to decrease the tolerance in the distance between the first connection surface and the second connection surface. This decrease in tolerance makes it possible in particular to use laser-type welding between the first connection end of the first busbar and the second connection end of the second busbar.

This type of welding requires less bulky tools than electric welding. Space is therefore freed around the first connection end of the first busbar and the second connection end of the second busbar, in particular for the installation of electronic components.

In a first variant, the ramp is formed in the second busbar.

Producing the ramp in the second busbar makes it possible to reduce the number of parts and the assembly of the electronic system. In such a case, the first bearing surface may bear an electrically insulating material on the first bearing surface to provide electrical insulation between the casing and the second busbar.

In a second variant, the ramp is formed in the first bearing surface and a shim is borne by the second busbar and interposed between the casing and the second busbar.

In a third variant, the ramp is formed in the second bearing surface, the second bearing surface forming part of a shim borne by the second busbar and interposed between the casing and the second busbar.

The use of a shim in the second variant and the third variant makes it possible to simplify the shaping of the second busbar. Specifically, in these variants, it is not necessary to produce a ramp shape in the second busbar. The ramp shape is produced in the casing or in the shim, parts in which the production of a ramp is easier. It may in particular be produced directly by molding or by machining.

According to one additional feature of the invention, the shim has a third bearing surface opposite the second bearing surface and the second busbar has a fourth bearing surface, the third bearing surface being in contact with the fourth bearing surface.

According to one additional feature of the invention, the shim is distinct from the support and the shim bears on the support when the electronic unit is inserted into the casing in the opposite direction to the direction of insertion of the electronic unit into the casing.

The use of a shim that is distinct from the support makes it possible to simplify the production of the support. In particular, in the case of a support overmolded onto the second busbar, the molding tool will be simpler due to the absence of a slide which may be necessary for the production of the shim.

According to one additional feature of the invention, the shim is mounted in a form-locking manner on the second busbar.

The form locking prevents loss of the shim when handling the electronic unit.

According to one additional feature of the invention, the second busbar comprises a flat portion with two edges and the shim has two slideways in which the two edges of the flat portion of the second busbar are accommodated.

According to one additional feature of the invention, one from between the shim and the second busbar comprises a recess and the other from between the shim and the second busbar comprises a protuberance that is intended to penetrate into the recess so as to limit the movement of the shim on the second busbar in the direction of insertion of the electronic unit into the casing.

According to one additional feature of the invention, the electronic unit is a filter block comprising a capacitor.

According to one additional feature, one terminal of the capacitor is directly connected to the second busbar, in particular by welding, brazing or crimping.

According to one additional feature of the invention, the distance between the first connection surface and the second connection surface is between 0 and 0.7 mm, preferably between 0 and 0.5 mm.

Such a distance makes it possible to perform laser welding without tools allowing the first connection surface to be brought closer to the second connection surface.

According to one additional feature of the invention, the first connection end of the first busbar is welded, in particular by laser welding, to the second connection end of the second busbar.

According to one additional feature of the invention, the electronic unit comprises a cover comprising a metal part in line with a gap formed between the first connection surface of the first busbar and the second connection surface of the second busbar in the insertion direction.

The use of such a metal part makes it possible to block the laser beam after the region to be welded.

The invention also relates to an electrical assembly comprising:
an electronic system as described above,
a rotary electric machine.

The invention may be better understood from reading the following description of non-limiting exemplary embodiments thereof and on studying the appended drawing, in which.

In all of the figures, elements that are identical or perform the same function bear the same reference numerals. The following embodiments are examples. Although the description refers to one or more embodiments, this does not necessarily mean that each reference sign relates to the same embodiment, or that the features only apply to just one embodiment. Individual features of different embodiments may also be combined or interchanged in order to create other embodiments.

Figure 1:
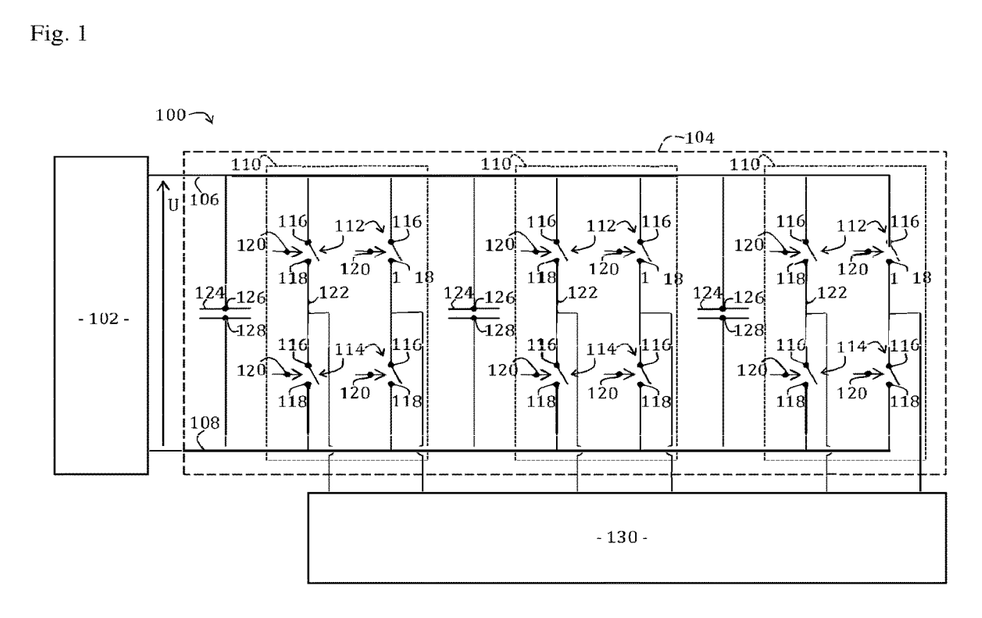
FIG. 1 shows a circuit diagram of an electrical assembly comprising an electronic system according to the invention.

FIG. 1 shows an electrical assembly 100 in which the invention may be implemented.

The electrical assembly 100 is, for example, intended to be installed in a motor vehicle.

The electrical assembly 100 firstly has an electric power source 102 designed to deliver a DC voltage U, for example between 20 V and 100 V, for example 48 V. The electric power source 102 has for example a battery.

The electrical assembly 100 further comprises a rotary electric machine 130 comprising a plurality of phase windings (not shown) that are intended to have respective phase voltages.

The electrical assembly 100 further comprises an electronic system 104.

In the various embodiments shown in the figures, the electronic system 104 is a voltage converter 104. However, in other embodiments which are not shown, the assembly may perform a different function.

The voltage converter 104 is connected between the electric power source 102 and the electric machine 130 in order to perform a conversion between the direct voltage U and the phase voltages.

The voltage converter 104 firstly comprises a positive electric line 106 and a negative electric line 108 which are intended to be connected to the electric power source 102 in order to receive the direct voltage U, with the positive electric line 106 receiving a high electric potential and the negative electric line 108 receiving a low electric potential.

The voltage converter 104 further comprises at least one power electronic module 110 comprising one or more phase electric lines 122 that are intended to be respectively connected to one or more phases of the electric machine 130 in order to provide their respective phase voltages.

In the described example, the voltage converter 104 comprises three power electronic modules 110 each comprising two phase electric lines 122 connected to two phases of the electric machine 130.

More specifically, in the described example, the electric machine 130 comprises two three-phase systems each comprising three phases and intended to be electrically phase-shifted from one another by 120°. Preferably, the first phase electric lines 122 of the power electronic modules 110 are respectively connected to the three phases of the first three-phase system, whereas the second phase electric lines 122 of the power electronic modules 110 are respectively connected to the three phases of the second three-phase system.

Each power electronic module 110 comprises, for each phase electric line 122, a first controllable switch 112 connected between the positive electric line 106 and the phase electric line 122 and a second controllable switch 114 connected between the phase electric line 122 and the negative power line 108. The controllable switches 112, 114 are thus arranged so as to form a chopping arm, in which the phase electric line 122 forms a center tap.

Each controllable switch 112, 114 comprises first and second main terminals 116, 118 and a control terminal 120 intended to selectively open and close the controllable switch 112, 114 between its two main terminals 116, 118 depending on a control signal that is applied thereto. The controllable switches 112, 114 are preferably transistors, for example, Metal-Oxide Semiconductor Field-Effect Transistors (MOSFETs) having a gate forming the control terminal 120, and a drain and a source respectively forming the main terminals 116, 118.

In the example described, the controllable switches 112, 114 each have the form of a plate that is for example substantially rectangular and that has an upper face and a lower face. The first main terminal 116 extends over the lower face, whereas the second main terminal 118 extends over the upper face. Furthermore, the lower face forms a heat sink face.

The voltage converter 104 further comprises, for each power electronic module 110, a filtering capacitor 124 having a first terminal 126 and a second terminal 128 respectively connected to the positive electric line 106 and to the negative electric line 108.

It will be appreciated that the positive electric line 106, the negative electric line 108 and the phase electric lines 122 are rigid elements designed to withstand electric currents of at least 1 A. They preferably have a thickness of at least 1 mm.

Furthermore, in the example described, the electric machine 130 simultaneously has an alternator and electric motor function. More specifically, the motor vehicle further comprises a combustion engine (not shown) having an output shaft, to which the electric machine 130 is connected via a belt (not shown). The combustion engine is intended to drive the wheels of the motor vehicle by means of its output shaft. Thus, during operation as an alternator, the electric machine supplies the electric power source 102 with electrical energy based on the rotation of the output shaft. The voltage converter 104 then operates as a rectifier. During operation as an electric motor, the electric machine drives the output shaft (in addition to or else instead of the combustion engine). The voltage converter 104 then operates as an inverter.

The electric machine 130 is located, for example, in a gearbox or else in a clutch of the motor vehicle or else in place of the alternator.

Figure 2:
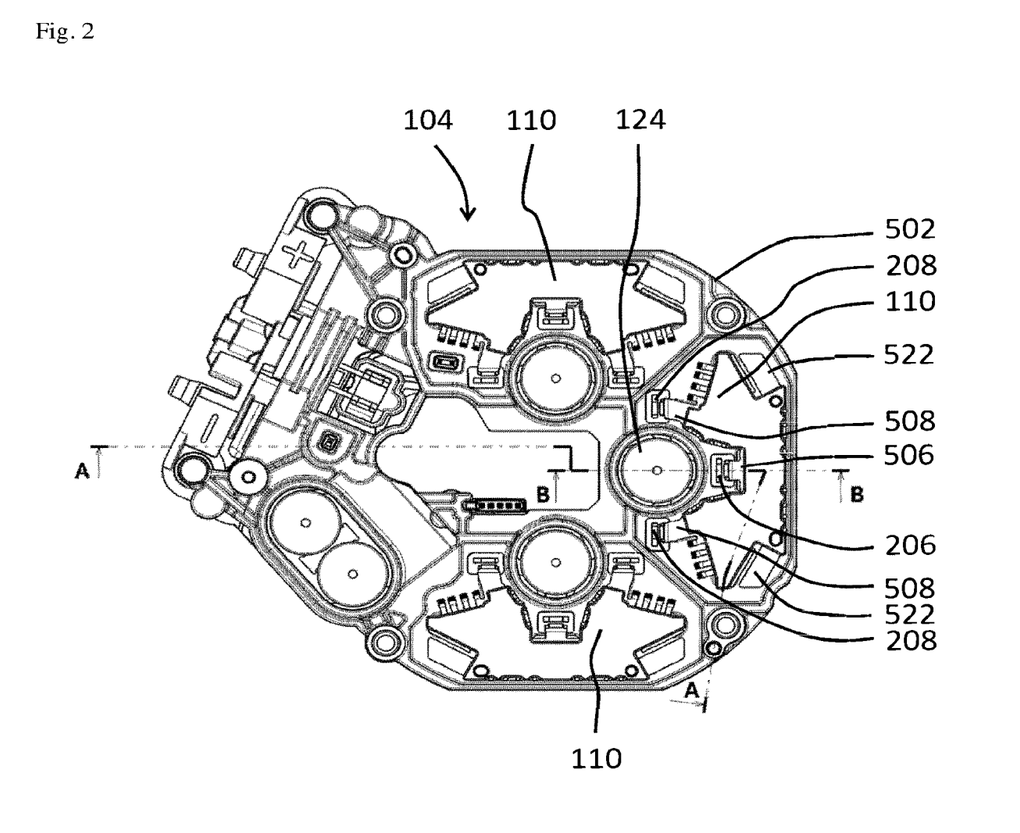
FIG. 2 shows a top view of an electronic system.

FIG. 2 shows a voltage converter 104 comprising:
a casing 502,
a power electronic module 110,
a filtering capacitor 124.

The power electronic module 110 comprises a first busbar 506, 508. The first busbar 506, 508 is, for example, a first positive busbar 506 electrically connected to the positive electric line 106 or a first negative busbar 508 connected to the negative electric line 108.

The power electronic module 110 further comprises a busbar 522 connected to one of the phase electric lines 122.

The first busbar 506, 508 is connected to a second busbar 206, 208. The second busbar 206, 208 is, for example, a second positive busbar 206 electrically connected to the positive electric line 106 or a second busbar 208 connected to the negative electric line 108.

The second busbar 206, 208 is, for example, electrically connected to the first terminal 126 or to the second terminal 128 of the filtering capacitor 124.

Figure 3:
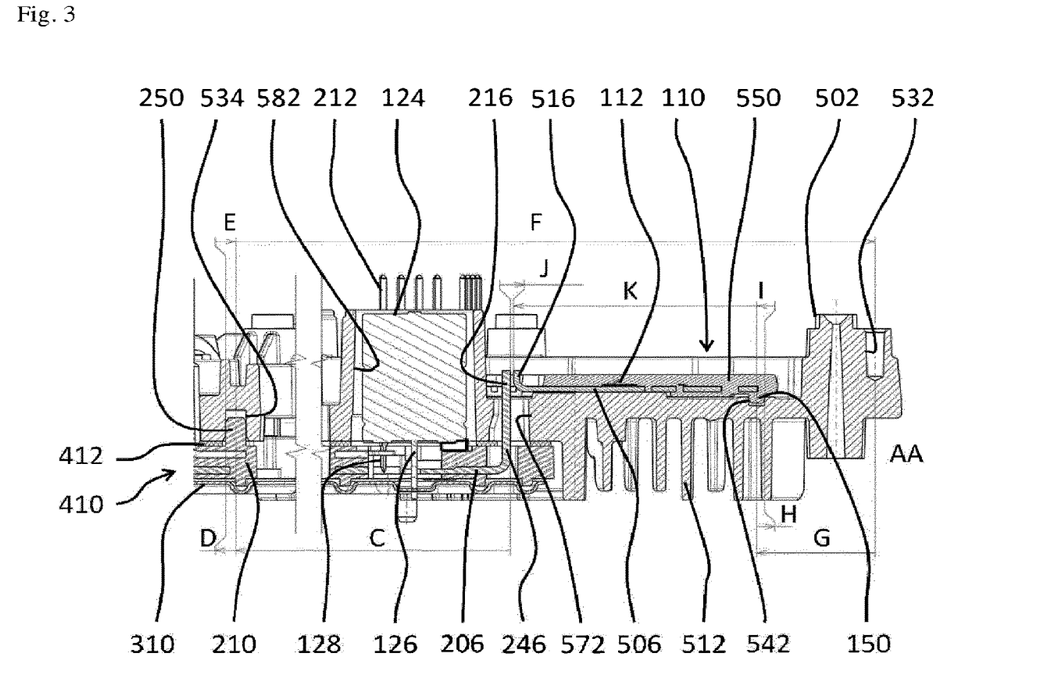
FIG. 3 shows a view in partial cross section of an electronic system without the invention.
Figure 4:
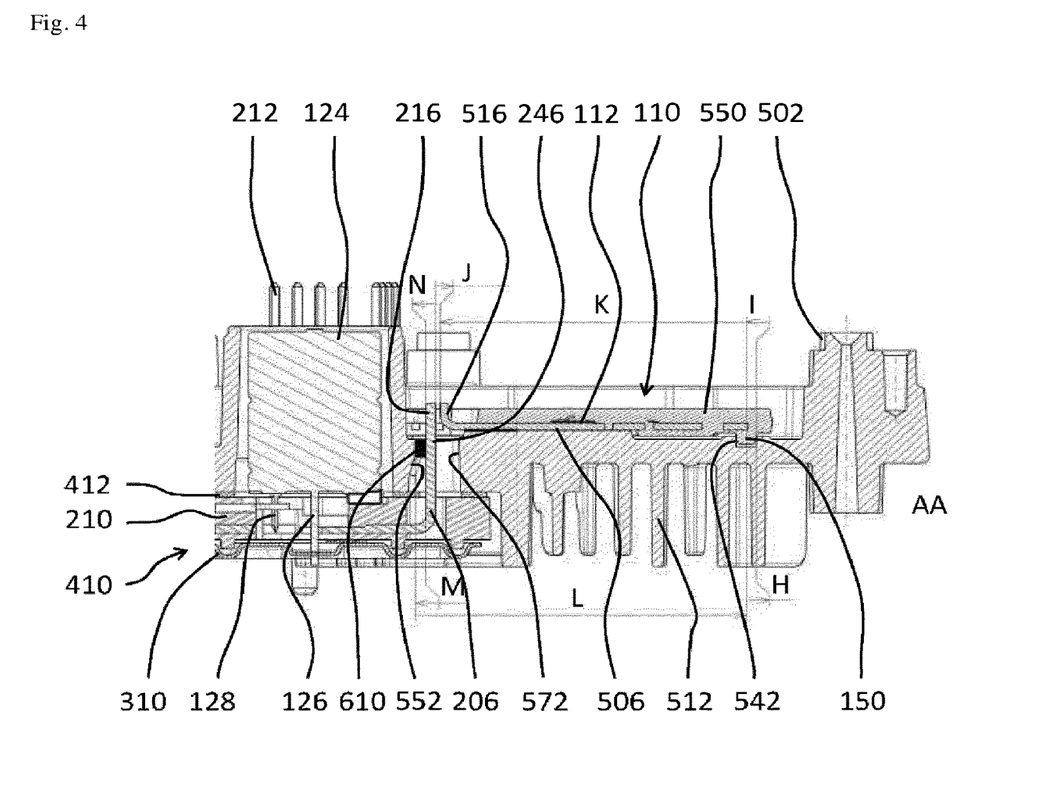
FIG. 4 shows a schematic view in partial cross section of an electronic system according to a first embodiment of the invention.

FIG. 2 further shows a first line AA of the broken section shown in FIG. 3 and FIG. 4 and a second line BB of the broken section shown in FIG. 5, FIG. 6, FIG. 7 and FIG. 8.

FIG. 3 shows a section through the voltage converter 104 to illustrate the technical problem to be solved by the invention.

The power electronic module 110 may further comprise a control pin 212 connected to the control terminal 120.

The power electronic module may further comprise a casing 550 overmolded onto the first controllable switch 112, the second controllable switch 114, the first busbar 506 and the control pin 212.

The power electronic module 110 is attached to the casing 502 using an attachment means, not shown.

The power electronic module 110 comprises a lower face and an upper face. The lower face of the power module 110 comprises a heat dissipation surface. This heat dissipation surface is in thermal contact with a heat exchange surface of the casing 502. The thermal contact is, for example, made using a thermal paste or a thermal adhesive.

The casing 502 may also comprise cooling fins 512, for example on the surface of the casing 502 opposite the heat exchange surface of the casing 502.

The power electronic module 110 is positioned on the casing 502 by virtue of first positioning means. The first positioning means comprise, for example, a first positioning stud 150 and a first positioning hole 542. The first positioning stud 150 is, for example, formed in the overmolded casing 550. The first positioning hole 542 is, for example, formed in the casing 502. The first positioning means may comprise a plurality of first positioning studs 150 and of first positioning holes 542.

The voltage converter 104 further comprises an electronic unit 410 intended to be inserted into the casing 502 in an insertion direction S.

The electronic unit 410 comprises:
a support 210,
the second busbar 206, 208, the second busbar 206, 208 being attached to the support 210.

The electronic unit 410 may further comprise the filtering capacitor 124.

The first terminal 126 of the filtering capacitor 124 is, for example, connected to the second positive busbar 206 and the second terminal of the filtering capacitor 124 is, for example, connected to the second negative busbar 208.

The support 210 is, for example, overmolded onto the second busbar 206, 208.

The support 210 comprises a first bearing zone that bears on a second bearing zone of the casing 502 at the end of the insertion of the electronic unit 410 into the casing 502.

The bearing between the first bearing zone and the second bearing zone may be performed by means of a seal 412, for example an adhesive seal.

The electronic unit 410 is positioned relative to the casing 502 by virtue of second positioning means. The second positioning means comprise, for example, a second positioning stud 250 and a second positioning hole 534. The second positioning stud 250 is, for example, formed in the support 210. The second positioning hole 534 is, for example, formed in the casing 502. The second positioning means may comprise a plurality of second positioning studs 250 and of second positioning holes 534.

The electronic unit 410 may further comprise a cover 310. The cover 310 is attached to the support 210, for example by bonding. A seal, not shown, may provide a seal between the support 210 and the cover 310. The adhesive may perform the function of a seal.

This seal between the cover 310 and the support 210 forms a reservoir into which it is possible to pour a gel or a resin to protect, for example against corrosion, those parts which are not overmolded by the support 210 of the second busbar 206 and the terminals 126, 128 of the capacitor.

The use of the seal 412 between the support 210 and the casing 502 makes it possible to increase the volume of the reservoir and therefore to increase the areas protected by the gel or the resin.

The casing 502 may comprise a centering hole 532 serving as a reference for the positioning of the positioning means for the elements mounted on the casing 502, such as the power electronic module 110 and the electronic unit 410.

The first busbar 506, 508 comprises a first part that is oriented overall in the insertion direction S. The first part comprises a first connection end 516 that has a first connection surface 526.

The first connection end 516 may, in particular, be perpendicular to the part of the first busbar 506, 508 which is in the casing 550.

The first connection end 516 may form a bend 536 with the part of the first busbar 506, 508 which is in the casing 550.

The second busbar 206, 208 comprises a second part 246 that is oriented overall in the insertion direction S. The second part 246 comprises a second connection end 216 that has a second connection surface 226.

The casing 502 comprises an opening 572 allowing the passage of the second part 246 when the electronic unit 410 is inserted into the casing 502.

The casing 502 may also comprise a cavity 582 to accommodate the capacitor 124. In the various examples shown in the figures, the cavity 582 is a through-cavity.

In other examples which are not shown in the figures, the cavity 582 may be a blind cavity. This blind cavity type has a bottom. The bottom may comprise a surface for heat exchange with the capacitor 124 so as to facilitate the removal of the heat generated by the capacitor 124 via the casing 502.

Once the electronic unit 410 has been inserted into the casing 502, the first connection end 516 and the second connection end 216 are at the same level in the insertion direction S such that the first connection surface 526 faces the second connection surface 226.

To make an electrical connection between the first connection surface 526 and the second connection surface 226, it is necessary to control the distance J between the first connection surface 526 and the second connection surface 226.

For example, the use of a laser welding method to make the electrical connection between the first connection surface 526 and the second connection surface 226 requires a distance J between the first connection surface 526 and the second connection surface 226 that is between 0 and 0.7 mm, preferably between 0 and 0.5 mm.

Other welding processes such as TIG (tungsten inert gas) welding may also be used. A similar tolerance for the distance J between the first connection surface 526 and the second connection surface 226 must also be observed to obtain a good electrical connection.

The distance J between the first connection surface 526 and the second connection surface 226 is dependent on a long chain of dimensions which makes it difficult to observe a dimensional tolerance suitable for making a connection by welding between the first connection surface 526 and the second connection surface 226.

Specifically, the chain of dimensions comprises, in the voltage converter 104 shown in FIG. 3, the following dimensions measured in a plane perpendicular to the insertion direction:
  the distance C between the second connection surface 226 and the second positioning stud 250,
  the radius D of the second positioning stud 250,
  the radius E of the second positioning hole 534,
  the distance F between the second positioning hole 534 and the centering hole 532,
  the distance G between the centering hole 532 and the first positioning hole 542,
  the radius H of the first positioning hole 542,
  the radius I of the first positioning stud 150, and
  the distance K between the first positioning stud 150 and the first connection surface 526.

FIG. 4 schematically shows a voltage converter 104 according to the invention.

The voltage converter of FIG. 4 is similar to the voltage converter of FIG. 3. However, the electronic unit 410 further comprises a shim 610 interposed between a first bearing surface 552 of the casing 502 and the second part 246 of the second busbar 206, 208.

The shim 610 is made of an electrically insulating material, in particular of plastic.

The first bearing surface 552 is formed in the opening 572 in the casing 502.

The use of the shim 610 between the first bearing surface 552 and the second busbar 206 makes it possible to decrease the tolerance for the distance J between the first connection surface 526 and the second connection surface 226 by decreasing the length of the chain of dimensions between the first connection surface 526 and the second connection surface 226.

The chain of dimensions comprises, in the voltage converter 104 shown in FIG. 4, the following dimensions measured in a plane perpendicular to the insertion direction:
  the thickness N of the second part 246 of the second busbar 206,
  the thickness M of the shim 610,
  the distance L between the first bearing surface 552 and the first positioning hole 542,
  the radius H of the first positioning hole 542,
  the radius I of the first centering stud 150, and
  the distance K between the first centering stud 150 and the first connection surface 526.

This decrease in the chain of dimensions linked to the distance J between the first connection surface 526 and the second connection surface 226 makes it possible to improve and therefore decrease the tolerance for the distance J between the first connection surface 526 and the second connection surface 226.

FIG. 5, FIG. 6, FIG. 7 and FIG. 8 show various stages in the insertion of the electronic unit 410 into the casing 502 of the voltage converter 104 according to a first embodiment.

The first bearing surface 552 comprises a ramp 562 that is inclined relative to the insertion direction S.

The shim 610 bears on the support 210 in the opposite direction to the direction of insertion of the electronic unit 410 into the casing 502.

The shim 610 is, for example, borne by the second busbar 206, 208. A more detailed description of an exemplary connection between the shim and the second busbar 206, 208 will be given for the embodiment shown in FIG. 9 and FIG. 10.

The shim 610 comprises a second bearing surface 620 intended to slide on the first bearing surface 552 when the electronic unit 410 is inserted into the casing 502.

The shim 610 further comprises a third bearing surface 630. The third bearing surface 630 bears on a fourth bearing surface formed on the second part 246 of the second busbar 206, 208.

Figure 5:
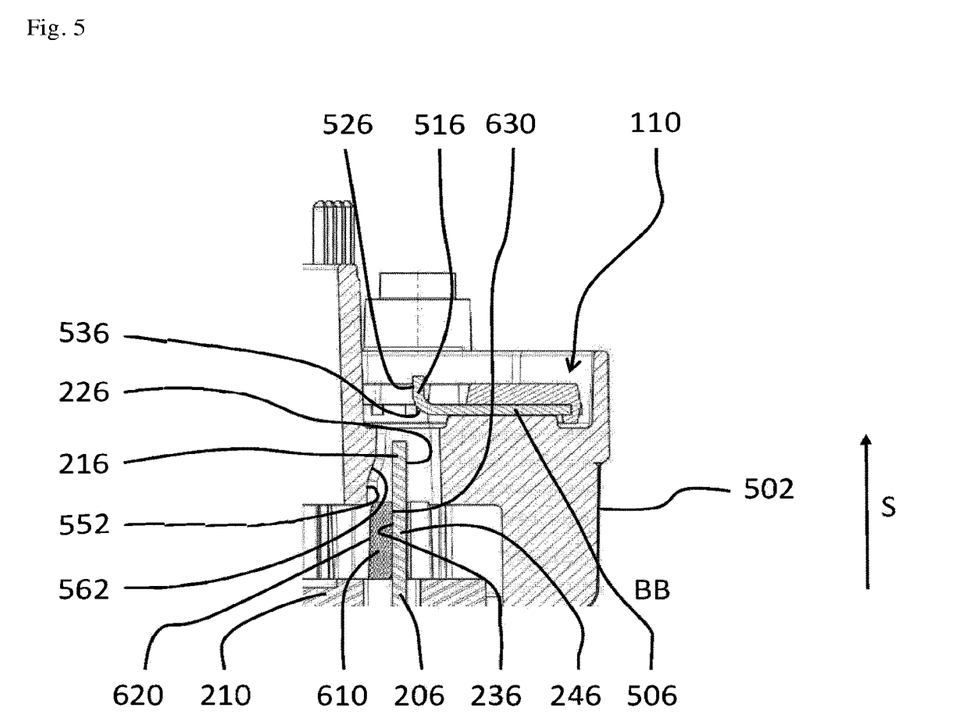
FIG. 5 shows a view in partial cross section of the electronic system of FIG. 4 in a first assembly step.

FIG. 5 shows a first step in the insertion of the electronic unit 410 into the casing 502 of the voltage converter 104 according to the first embodiment.

During this first step, the second bearing surface 620 of the shim 610 may come into contact with and begin to slide on the first bearing surface 552. However, such sliding is not necessary. The relative movement between the second bearing surface 620 of the shim 610 and the first bearing surface 552 may therefore take place at a distance, that is to say without contact.

The second busbar 206, 208 is deformed little and in particular is not deformed if there is no contact.

At the end of this first step, the second connection surface 226 may begin to face the first connection surface 526. In other words, the second connection surface 226 may start to overlap with the first connection surface 526 in the insertion direction S. It is thus possible to avoid contact between the second connection surface 226 and the bend 536. Such contact could make it more difficult, or even impossible, to insert the electronic unit 410 into the casing 502.

Figure 6:
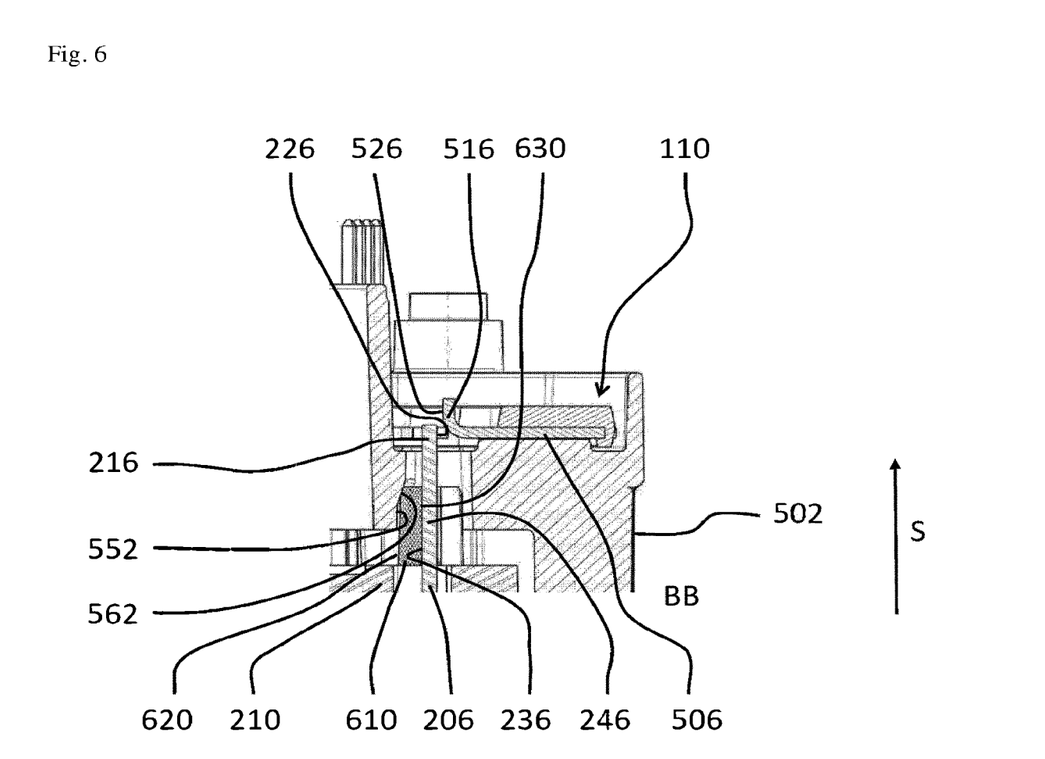
FIG. 6 shows a view in partial cross section of the electronic system of FIG. 4 in a second assembly step.

FIG. 6 shows a second step in the insertion of the electronic unit 410 into the casing 502 of the voltage converter 104 according to the first embodiment.

During this second step, the second bearing surface 620 of the shim 610 slides on the ramp 562 of the first bearing surface 552. With the third bearing surface 630 of the shim 610 being in contact with the fourth bearing surface 236 of the second busbar 206, 208, a force substantially perpendicular to the insertion direction S is produced on the second part 246 of the second busbar 206, 208. This force deforms the second busbar 206, 208 so as to bring the second connection surface 226 closer to the first connection surface 526.

Figure 7:
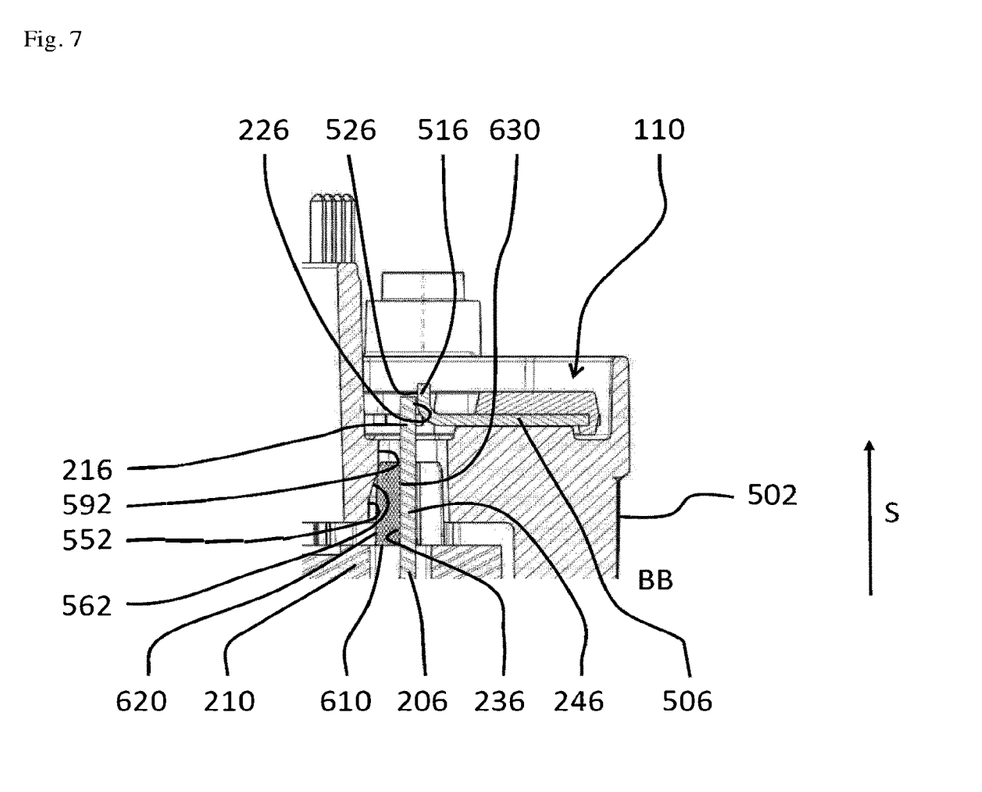
FIG. 7 shows a view in partial cross section of the electronic system of FIG. 4 in a third assembly step.

FIG. 7 shows a third step in the insertion of the electronic unit 410 into the casing 502 of the voltage converter 104 according to the first embodiment.

The first bearing surface 552 further comprises a reference surface 592.

During this third step, the second bearing surface 620 of the shim 610 slides on the reference surface 592. The distance J between the second connection surface 226 of the first connection surface 526 remains constant.

The shorter chain of dimensions seen previously makes it possible to decrease the dimensional tolerances for the distance J between the second connection surface 226 of the first connection surface 526. It is thus possible to obtain a distance J between the first connection surface 526 and the second connection surface 226 of between 0 and 0.7 mm, preferably between 0 and 0.5 mm.

A gap is formed between the first connection surface 526 of the first busbar 506, 508 and the second connection surface 226 of the second busbar 206, 208.

Figure 8:
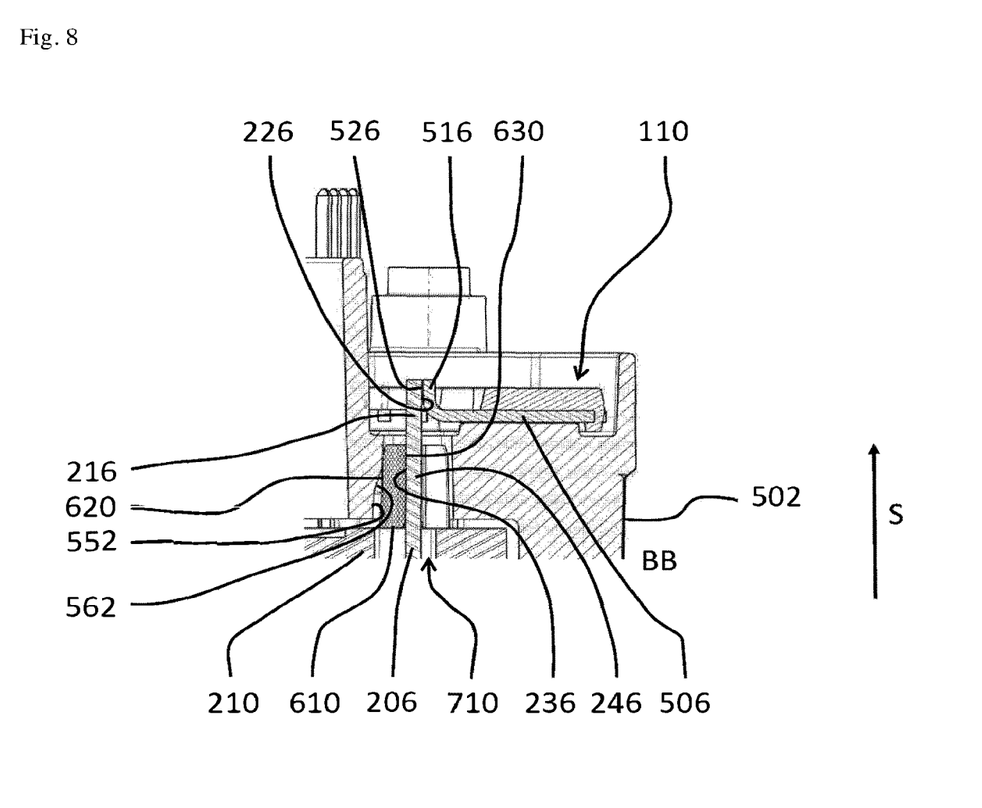
FIG. 8 shows a view in partial cross section of the electronic system of FIG. 4.

In FIG. 8, the electronic unit 410 is in its final position after insertion into the casing 502.

The decreased dimensional tolerance for the distance J between the second connection surface 226 of the first connection surface 526 allows, for example, the use of laser-type welding to electrically connect the first connection surface 526 and the second connection surface 226.

In the case of the use of laser welding between the second connection surface 226 of the first connection surface 526, it is particularly useful to provide an open space 710 in the shim 610 and the support 210 in line with the welding zone between the second connection surface 226 and the first connection surface. This open space 710 makes it possible to prevent excessive heating of the shim 610 and of the support 210 during the laser welding operation. Such excessive heating could burn the shim 610 and the support 210, in particular if the shim 610 and the support 210 are made of a plastic material.

It is advantageous to block the laser beam with a metal part. The cover 310 may comprise this metal part.

Other types of welding, such as TIG welding, may be made possible by virtue of this decrease in the dimensional tolerance for the distance J between the second connection surface 226 and the first connection surface 526.

Figure 9:
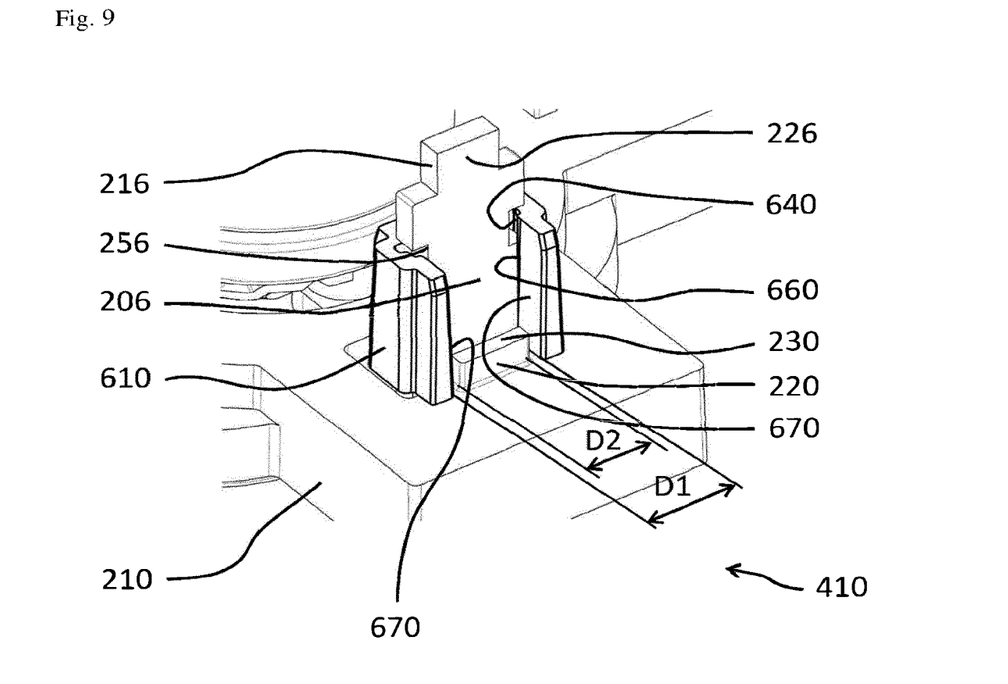
FIG. 9 shows a partial view of an electronic unit of an electronic system of FIG. 4 according to a second embodiment.
Figure 10:
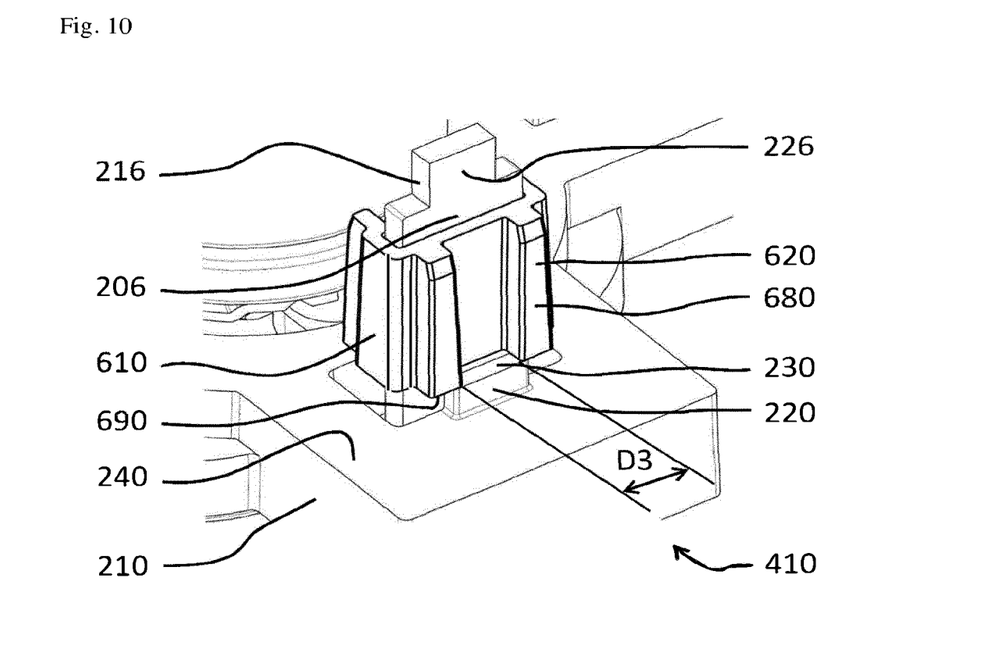
FIG. 10 shows a partial view of the electronic unit of FIG. 9.

FIG. 9 and FIG. 10 show a second embodiment of the invention in which the electronic unit has been improved with the addition of a poka-yoke device so as to avoid incorrect mounting of the shim 610.

In the second embodiment, the second part 246 of second busbar 206, 208 has a flat portion with two edges. The flat portion has a first planar surface and a second planar surface opposite the first planar surface. The first planar surface and the second planar surface are connected by the two edges.

The fourth bearing face 236 of the second busbar 206, 208 is formed on the first planar surface.

The shim 610 has two slideways 660 in which the two edges of the flat portion of the second part 246 of the second busbar 206, 208 are accommodated.

At least one slideway 660 comprises a protuberance 640.

The edge of the planar portion accommodated in the slideway 660 comprising the protuberance 640 has a recess 256 in which the protuberance 660 is accommodated when the portion of the edges of the flat portion of the second busbar 206, 208 is inserted into the slideways 660. The protuberance 660 and the recess 256 make it possible to ensure form locking of the mounting of the shim 610 on the electronic unit 410.

The movement of the shim 610 on the second part 246 of the second busbar 206, 208 in the direction of insertion S of the electronic unit 410 into the casing 502 is thus limited.

The shim 610 bears, for example, on the support 210.

The poka-yoke device comprises, for example:
two walls 670 oriented perpendicular to the second flat portion and in the insertion direction S, the two walls being spaced apart by a first distance D1,
a pad 220 formed on the support 210, the pad 220 having a length D2 shorter than D1 so as to be able to be inserted between the two walls 670.

The pad 220 comprises a first stop surface 230 that is offset with respect to a contact surface 240 of the support 210 on which the shim 610 bears.

The shim 610 comprises two ribs 680 separated by a third distance D3. The ribs bear the second bearing surface 620.

The ribs comprise a second stop surface 690 which faces the support 210.

The third distance D3 is shorter than the second distance D2.

FIG. 10 shows an attempt to insert the shim 610 onto the second part 246 of the second busbar 206, 208 with the incorrect orientation.

The shim 610 is blocked by the pad 220. The second bearing surface 690 abuts against the first stop surface 230. Thus, the shim 610 cannot come to bear on the contact surface 240. The incorrect orientation of the shim 210 may then be detected easily, for example visually or with optical automated detection means.

In other embodiments, other poka-yoke devices are used.

In one embodiment, not shown, the poka-yoke device comprises a protuberance in the shim which may be inserted into a recess formed in the support only when the shim is correctly oriented.

In another embodiment, not shown, the poka-yoke device comprises two protuberances which are offset in the direction S in the slideways and recesses which are also offset in the edges of the planar portion.

In another embodiment, not shown, the shim is formed with the support. For example, the support and the shim are produced by overmolding an electrically insulating material onto the second busbar.

In a first variant of this embodiment, the shim and the support are separate.

In a second variant of this embodiment, the shim and the support are formed in continuity of material. Advantageously, a thinned part may be formed between the support and the shim so as to facilitate the deformation of the second busbar when the electronic unit is inserted into the casing.

In another embodiment, not shown, the ramp is formed on the shim.

In another embodiment, not shown, a ramp is formed on the shim and a ramp is formed on the first bearing surface.

In another embodiment, not shown, the ramp is formed in the second busbar.

In this embodiment, the first bearing surface of the casing is made of an electrically insulating material, in particular a plastic material. For example, the casing is made of plastic material overmolded onto metal heat dissipation inserts comprising the heat exchange surface of the casing, this heat exchange surface being in thermal contact with the heat dissipation surface of the power electronic module.

The invention claimed is:

1. An electronic system comprising:
   a. a casing comprising a first bearing surface,
   b a first busbar attached to the casing and comprising a first connection end having a first connection surface,
   c. an electronic unit comprising a second bearing surface, the electronic unit being intended to be inserted into the casing in an insertion direction and the electronic unit comprising:
      i. a support,
      ii. a second busbar attached to the support and comprising a second connection end having a second connection surface,
   the second bearing surface being intended to slide on the first bearing surface when the electronic unit is inserted into the casing, wherein one from among the first bearing surface and the second bearing surface comprises a ramp that is inclined relative to the insertion direction for deforming the second busbar so as to bring the second connection surface closer to the first connection surface when the electronic unit is inserted into the casing.

2. The electronic system as claimed in claim 1, wherein the ramp is formed in the second busbar.

3. The electronic system as claimed in claim 2, wherein the first busbar is a busbar of a power electronic module able to supply the phase windings of a rotary electric machine.

4. The electronic system as claimed in claim 2, wherein the electronic unit is a filter block comprising a capacitor, one terminal of which is directly connected to the second busbar, in particular by welding, brazing or crimping.

5. The electronic system as claimed in claim 2, wherein the distance between the first connection surface and the second connection surface is between 0 and 0.7 mm, preferably between 0 and 0.5 mm.

6. The electronic system as claimed in claim 2, the first connection end of the first busbar is welded, in particular by laser welding, to the second connection end of the second busbar.

7. The electronic system as claimed in claim 2, wherein the electronic unit comprises a cover comprising a metal part in line with a gap formed between the first connection surface of the first busbar and the second connection surface of the second busbar in the insertion direction.

8. The electronic system as claimed in claim 1, wherein the ramp is formed in the first bearing surface.

9. The electronic system as claimed in claim 8, wherein a shim is borne by the second busbar and interposed between the casing and the second busbar.

10. The electronic system as claimed in claim 9, wherein the shim has a third bearing surface opposite the second bearing surface and the second busbar has a fourth bearing surface, the third bearing surface being in contact with the fourth bearing surface.

11. The electronic system as claimed in claim 10, wherein the shim is distinct from the support and the shim bears on the support when the electronic unit is inserted into the casing in the opposite direction to the direction of insertion of the electronic unit into the casing.

12. The electronic system as claimed in claim 11, wherein the shim is mounted in a form-locking manner on the second busbar.

13. The electronic system as claimed in claim 1, wherein the ramp is formed in the second bearing surface, the second bearing surface forming part of a shim borne by the second busbar and interposed between the casing and the second busbar.

14. The electronic system as claimed in claim 13, wherein the shim has a third bearing surface opposite the second bearing surface and the second busbar has a fourth bearing surface, the third bearing surface being in contact with the fourth bearing surface.

15. The electronic system as claimed in claim 1, wherein the first busbar is a busbar of a power electronic module able to supply the phase windings of a rotary electric machine.

16. The electronic system as claimed in claim 1, wherein the electronic unit is a filter block comprising a capacitor, one terminal of which is directly connected to the second busbar, in particular by welding, brazing or crimping.

17. The electronic system as claimed in claim 1, wherein the distance between the first connection surface and the second connection surface is between 0 and 0.7 mm, preferably between 0 and 0.5 mm.

18. The electronic system as claimed in claim 1, the first connection end of the first busbar is welded, in particular by laser welding, to the second connection end of the second busbar.

19. The electronic system as claimed in claim 1, wherein the electronic unit comprises a cover comprising a metal part in line with a gap formed between the first connection surface of the first busbar and the second connection surface of the second busbar in the insertion direction.

20. An electrical assembly comprising:
   a. an electronic system as claimed in claim 1,
   b. a rotary electric machine.

* * * * *